(12) United States Patent
Haruta et al.

(10) Patent No.: US 6,445,256 B1
(45) Date of Patent: Sep. 3, 2002

(54) OSCILLATOR AND RADIO EQUIPMENT

(75) Inventors: Kazumasa Haruta, Nagaokakyo; Sadeo Yamashita, Kyoto; Koichi Sakamoto, Otsu; Toru Tanizaki, Nagaokakyo, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/675,869

(22) Filed: Sep. 29, 2000

(30) Foreign Application Priority Data

Sep. 29, 1999 (JP) ............................................ 11-276706

(51) Int. Cl.$^7$ ................................................ H03B 9/12
(52) U.S. Cl. .............................. 331/117 D; 331/107 G; 331/107 DP; 331/107 SL; 333/247; 333/33; 333/263
(58) Field of Search ..................... 331/117 D, 107 G, 331/107 DP, 107 SL; 333/247, 33, 263

(56) References Cited

U.S. PATENT DOCUMENTS 5,872,485 A * 2/1999 Ishikawa et al. ............ 330/286
6,344,779 B1 * 2/2002 Haruta et al. ................ 331/96

FOREIGN PATENT DOCUMENTS

| JP | 622289 | 3/1994 |
| JP | 6105851 | 12/1994 |
| JP | 7154141 | 6/1995 |

* cited by examiner

Primary Examiner—Arnold Kinkead
(74) Attorney, Agent, or Firm—Ostrolenk, Faber, Gerb & Soffen, LLP

(57) ABSTRACT

The present invention provides a small-sized oscillator facilitating the adjustment of a resonance frequency, permitting mass productivity to be improved, sufficiently suppressing a fundamental wave, and permitting cost reduction, and provides radio equipment using the oscillator. In this oscillator, an oscillation circuit is formed by providing a line and a Gunn diode on a dielectric substrate. An NRD guide serving as an output transmission line is formed by disposing a dielectric strip between upper and lower conductor plates, and the above-mentioned line and the NRD guide are coupled. The cut-off frequency of this NRD guide is determined so that the fundamental wave component of an oscillation signal from the oscillation circuit is cut off, so that higher harmonic components are propagated.

7 Claims, 4 Drawing Sheets

OSCILLATOR AND RADIO EQUIPMENT

BACKGROUND OF THE INVENTION

1. Field of the Invention

The present invention relates to an microwave band or millimeter wave band oscillator having an oscillation circuit using a Gunn diode and other components, and to an output transmission line for outputting oscillation signals, and to radio equipment using this oscillator.

2. Description of the Related Art

Oscillators for use in the microwave band or millimeter wave band generally employ a negative resistance element such as a Gunn diode. Oscillators of this type intended for multiple oscillation (generation of harmonics) are disclosed in Japanese Examined Patent Application Publications 6-105851 and 6-22289.

Such an oscillation circuit intended for multiple oscillation can operate in, e.g., a millimetric band over 60 GHz, in which a Gunn diode cannot directly oscillate.

The oscillator disclosed in the above-mentioned Japanese Examined Patent Application Publication 6-105851 is characterized in that oscillation is obtained by cavity resonance using a waveguide, and in that the resonance frequency thereof is determined by a spatial volume. This raises problems, however. Since this oscillator has difficulty in adjusting frequency, it is unsuitable for mass production so as to incur a high cost, and it inevitably has a large size.

The oscillator disclosed in the above-mentioned Japanese Examined Patent Application Publication 6-22289, has a feature such that the occurrence of a fundamental wave is inhibited only by microstrip patterns. This creates a problem, however, that it is difficult to sufficiently suppress the occurrence of a fundamental wave, and that the microstrip patterns for inhibiting the fundamental waves attenuate even the signals of the higher harmonic to be used, resulting in an increased loss.

SUMMARY OF THE INVENTION

However, the present invention is able to solve the above-described problems and to provide an small-sized oscillator facilitating the adjustment of a resonance frequency, suitable for mass production and permitting a cost reduction, and to provide radio equipment using it.

The present invention is also able to provide an oscillator sufficiently suppressing the occurrence of a fundamental wave, and permitting a low loss, and to provide radio equipment using it.

In order to accomplish the above, the oscillator in accordance with the present invention may comprise an oscillation circuit formed on a dielectric substrate, and an output transmission line for transmitting the oscillation output signals of the oscillation circuit. In this oscillator, the output transmission line is a transmission line having cut-off characteristics, the output transmission line including a dielectric portion between two conductor plates substantially parallel to each other; and the cut-off frequency of the transmission line is determined so as to cut off the fundamental wave component, or the fundamental wave component and lower order harmonic components of an oscillation signal generated by the oscillation circuit, so that the higher harmonic components having higher frequencies than them are propagated. Thereby, a fundamental component and/or lower order harmonics are cut off, and only higher harmonics are outputted to the output transmission line.

Also, by forming the oscillation circuit on the dielectric substrate, the formation of a circuit pattern is facilitated, and a reduction in the size is achieved.

In the oscillator in accordance with the present invention, the output transmission line may be a dielectric line formed by disposing a dielectric strip between two, conductor plates substantially parallel to each other. Also, the output transmission line may be a planar dielectric line formed by providing conductor patterns constituting slots opposed to each other on the top and bottom surfaces of a dielectric plate.

In the oscillator in accordance with the present invention, the oscillation circuit may be formed by mounting a negative resistance element in the vicinity of the short circuit position of the line of which at least one end is opened, the line having a length of integral multiples of a half wavelength; and the line and the output transmission line are coupled.

In the oscillator in accordance with the present invention, stubs may be provided on a bias line supplying the bias voltage with respect to the negative resistance element so that the impedance when viewing the bias power source from the connection point of the negative resistance element is high at the frequency of the fundamental wave and the frequencies of the higher harmonics.

In the oscillator in accordance with the present invention, a variable reactance element may be connected to the line of the oscillator, and the line for supplying the control voltage to the variable reactance element is provided, which permits an adjustment or modulation of an oscillation frequency.

In the oscillator in accordance with the present invention, a weak-coupled terminal may be provided to the oscillating circuit, so that this terminal can monitor an oscillation signal.

In the oscillator in accordance with the present invention, the output transmission line may be a dielectric line formed by disposing a dielectric strip between two conductor plates substantially parallel to each other; a slot is formed in one of the conductor plates; the dielectric substrate is disposed on the outside of the one of the conductor plates; and the line of the oscillator and the dielectric line are coupled.

Also, in the oscillator in accordance with the present invention, the dielectric substrate may be accommodated in a case; the bias line comprises portions each having wider widths and portions each having narrower widths; and a spring for fixing the dielectric substrate at the inner surface of the case is provided in the vicinity of the narrower portion of the bias line.

The radio equipment in accordance with the present invention may be a transmitter/receiver such as millimeter wave radar, using an oscillator having any one of these structures.

The above and other features and advantages of the present invention will be apparent from the following detailed description of the preferred embodiments of the invention in conjunction with the accompanying drawings in which like references denote like elements and parts.

DESCRIPTION OF EMBODIMENTS OF THE INVENTION

The construction of an oscillator in accordance with a first embodiment of the present invention will be described with reference to FIGS. 1A through 3.

Figure 1A:
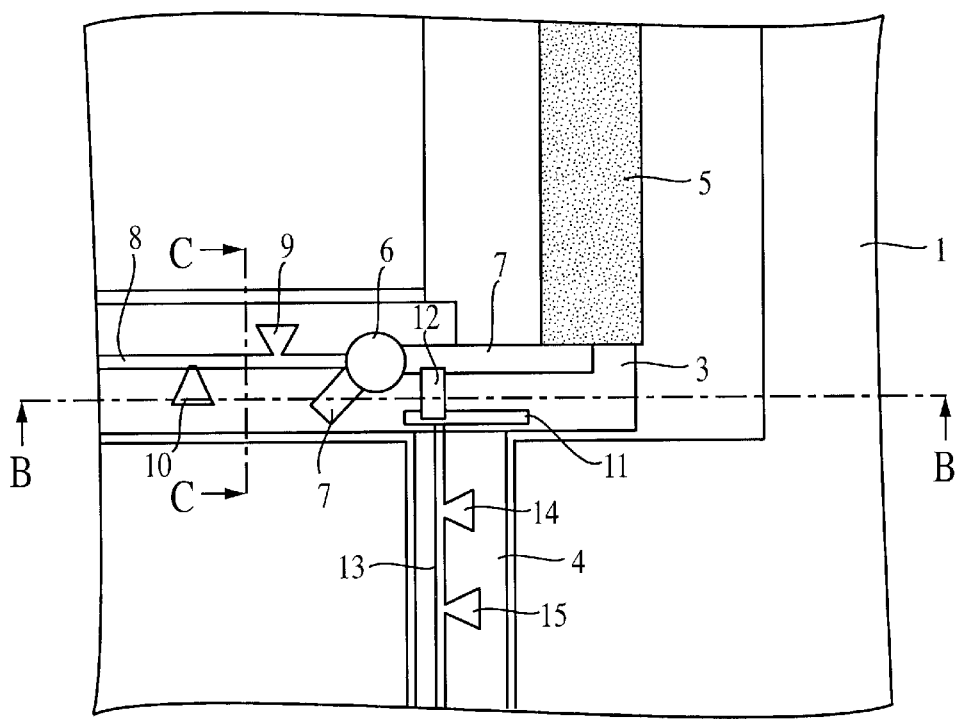
FIGS. 1A–1C are diagrams showing the construction of an oscillator in accordance with a first embodiment of the present invention.
Figure 1B:
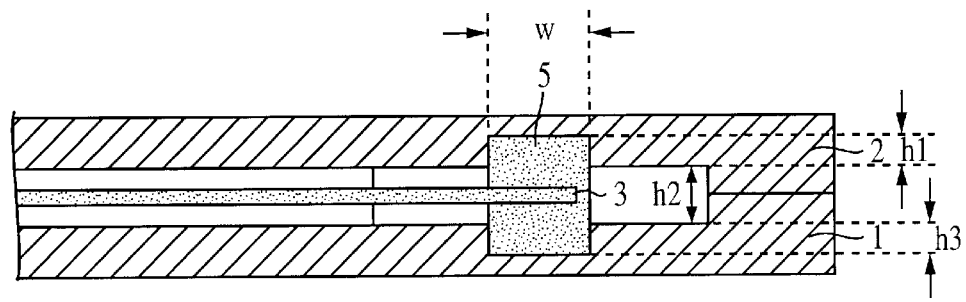
Figure 1C:
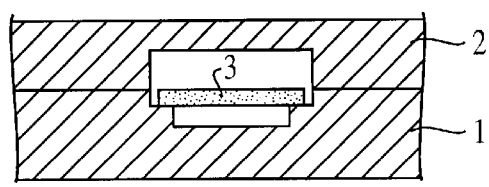

FIG. 1A is a plan view showing an oscillator having two (upper and lower) conductor plates, without showing the upper conductor plate. FIGS. 1B and 1C are cross-sectional views taken along the lines B—B and C—C, respectively. In FIGS. 1A–1C, reference numerals 1 and 2 denote a lower conductor plate and an upper conductor plate, respectively. These two conductor plates form an oscillator in the space sandwiched therebetween. Reference numerals 3 and 4 each denote dielectric substrates. A line 7 for the oscillation circuit is provided on the top surface of the dielectric substrate 3, and at a predetermined position thereof, a Gunn diode 6 is connected. The Gunn diode 6 is of a pill package type, and is mounted on the lower conductor plate 1. The protruded electrode of the Gunn diode is inserted through a hole formed in the dielectric substrate 3, and the electrode thereof is electrically connected to the line 7 by soldering or the like.

A bias line 8 for supplying the bias voltage with respect to the Gunn diode 6 is formed on the top surface of the dielectric substrate 3, and stubs 9 and 10 are disposed at predetermined positions thereon. A variable reactance element 12 is mounted on the dielectric substrate 3, and between the line 7 and a stub 11 for the variable reactance element.

A line 13 for supplying the control voltage with respect to the variable reactance element 12 is formed on the top surface of the dielectric substrate 4, and stubs 14 and 15 are formed at predetermined positions thereon.

In FIG. 1, reference numeral 5 denotes a dielectric strip. A groove having the same width as that of the dielectric strip 5 is formed at predetermined positions of the upper and lower conductor plates 1 and 2, and the dielectric strip 5 is disposed along the groove. The dielectric strip 5 and the upper and lower conductive plates 1 and 2 form a non-radiative dielectric line (hereinbelow referred to as an "NRD guide"). In particular, in this example, the distance between the upper and lower conductor plates in the space portions on both sides of the dielectric strip 5 is set to be narrower than the distance between the upper and lower conductor plates in the dielectric strip 5 portion, whereby a non-radiative dielectric line inhibiting the propagation of the LSE01 mode and propagating the LSM01 which is a single mode, is achieved.

The dielectric substrate 3 is disposed so that the vicinity of the end portion of the line 7 provided on the top surface thereof extends in the direction orthogonal to the axial direction of the dielectric strip 5, and in the direction parallel with the upper and lower conductor plates, and that the open end thereof is situated at the center in the width direction of the dielectric strip 5. Thereby, the mode of the suspended line formed by the line 7 and the upper and lower conductor plates, and the LSM01 mode of the dielectric line, are magnetic-field coupled.

Figure 2:
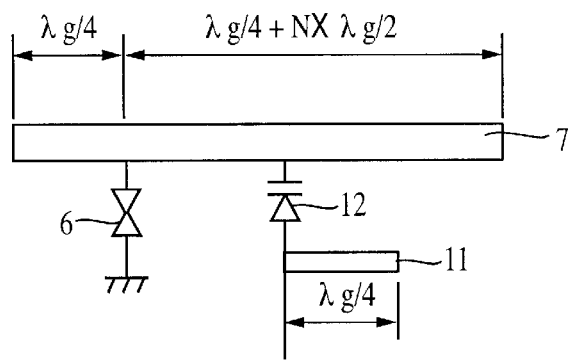
FIG. 2 is a diagram showing the relationship between a line of an oscillation circuit and the connection positions for a Gunn diode and other components in the oscillator in FIGS. 1A–1C.

In FIG. 2, the construction of the oscillation circuit shown in FIGS. 1A–1C is illustrated. In this example, the length of the line 7 is set to $(N+1) \times \lambda g/2$, where $\lambda g$ is one wavelength on the line 7, and N is an integer not less than 1. The line 7 is also set to be opened at both ends. Since the impedance of the Gunn diode 6 is as low as several ohms, impedance matching is made by connecting the Gunn diode 6 at a position at a distance of $\lambda g/4$ from one of the open ends of the line, that is, at the position which is equivalently the approximate short-circuit point. A variable reactance element 12 is connected at a predetermined position between the connection position and the other open end. Since the stub 11 for the variable reactance element 12 has a length of $\lambda g/4$, and the ends thereof are opened, there is provided a construction wherein the variable reactance element 12 is connected between the connection point thereof with respect to the line 7 and a ground equivalent.

By the above-described construction, an oscillation signal generated by the Gunn diode 6 is coupled with the dielectric line via the line 7, and is transmitted via the dielectric line.

The above-mentioned NRD guide has cut-off characteristics, and the dielectric constant and the dimension of the dielectric strip 5 and the dimension of the space between the upper and lower conductor plates are determined so that the cut-off frequency of the NRD guide is higher than a fundamental wave oscillation frequency of the Gunn diode 6 and lower than the frequency of a second harmonic (double wave). Therefore, only the higher harmonic components of the oscillation signal is transmitted to the NRD guide. For example, when letting the fundamental oscillation frequency of the Gunn diode 6 be 38 GHz, 76 GHZ which is a second harmonic thereof is transmitted to the NRD guide.

A technique for making -the cut-off frequency of an NRD guide a desired value, is described in the article by Kuroki et al., Millimeter Wave Band Cut-off Filter using an NRD Guide, IEICE, 7/1, Vol. J70-C, No. 1, PP. 117–119.

For example, when w, h1, h2, and h3 shown in FIG. 1B, and the dielectric constant of the dielectric strip 5, are 1.2 mm, 0.5 mm, 0.8 mm; 0.5 mm and 2.04, respectively, the value of the cut-off frequency becomes 67.06 GHz. This means that the signal of a frequency not more than 67.06 GHz does not propagate through the dielectric strip 5. Here, w is the width of the dielectric strip 5, h1 is the distance between the top surface of the dielectric strip 5 and the bottom surface of the upper conductor plate 2, h2 is the distance between the bottom surface of the upper conductor plate 2 and the top surface of the lower conductor plate 1, and h3 is the bottom surface of the dielectric strip 5 and the top surface of the lower conductor plate 1.

Meanwhile, harmonics of a order not less than a third order are also transmitted, but since the power output thereof decreases as the harmonic becomes a higher order, the influence thereof is negligible as compared with that of the fundamental wave.

Since the oscillation frequency of the Gunn diode 6 is varied depending on the reactance of the variable reactance element 12 loaded on the line 7, the oscillation frequency can be adjusted or modulated by the control voltage with respect to the variable reactance element 12. Also, since the ratio of the oscillation frequency change with respect to the control voltage change is varied depending on the connection position of the variable reactance element 12 with respect to the line 7, the adjustment width or the modulation width for the frequency is determined by this connection position of the variable reactance element.12.

Figure 3:
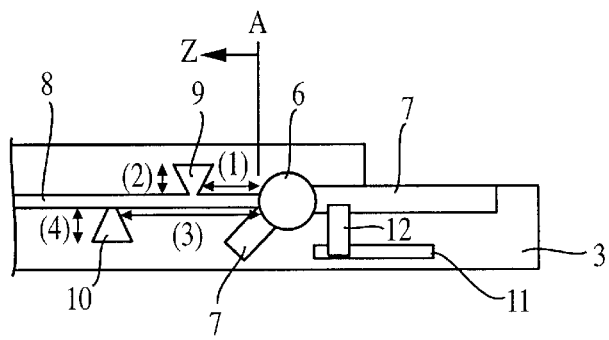
FIG. 3 is a diagram showing the construction of a bias line of the oscillation circuit of the oscillator in FIGS. 1A–1C.

In FIG. 3, the construction of the bias line portion shown in FIGS. 1A–1C is illustrated. A stub 9 is disposed at a distance (1) from the position of the Gunn diode 6, and the distance from the connection point thereof with respect to the bias line 8 to its open end is (2). On the other hand, a stub 10 is disposed at a distance (3) from the position of the Gunn diode 6, and the distance from the connection point thereof with respect to the bias line 8 to its open end is (4). Here, (1) is the length from the connection position of the Gunn diode, that is, from the position which is equivalently the approximate short-circuit point, and is set to be about ¼ wavelength long with respect to the wavelength of the second harmonic on the bias line. (2) is set to be about ¼ wavelength long with respect to the wavelength of the second harmonic. (3) is the length from the connection position of the Gunn diode, that is, from the position which is equivalently the approximate short-circuit point, and is set to be about ¼ wavelength long with respect to the wavelength of the fundamental wave on the bias line. (4) is set to be about ¼ wavelength long with respect to the wavelength of the fundamental wave. Here, the length (3) from the above-described approximate short-circuit point to the connection point of the stub 10, has been determined in consideration of the effect of the stub 9 (the lengths (1) and (2)).

Therefore, the impedance Z when viewing the power source side from A is a high impedance (ideally, the impedance maximum point on the Smith chart) in the fundamental wave frequency and the second harmonic frequency. The stub 9 works as the trap for the second harmonic component, and the stub 10 works as the trap for the fundamental wave component. Thereby, there is no risk that an oscillation signal leaks to the bias power source side via the bias line, which leads to an improvement in modulation characteristics and oscillation efficiency.

Stubs similar to the above-mentioned two stubs are provided on a line 13 for control voltage supply as shown in FIGS. 1A–1C. A stub 14 is connected at the position at a distance of ¼ of a second harmonic wavelength from the equivalent short-circuit point of the stub 11 for the variable reactance element, and the length from the connection point thereof to the open end is set to ¼ of the second harmonic wavelength. On the other hand, a stub 15 is connected at the position at a distance of ¼ of the fundamental wave wavelength from the equivalent short-circuit point of the stub 11 for the variable reactance element, and the length from the connection point thereof to the open end is set to ¼ of the fundamental wave wavelength. Therefore, there is no risk that an oscillation signal leaks to the side of the line 13 for control voltage supply, which leads to an improvement in modulation characteristics and oscillation efficiency.

Figure 4:
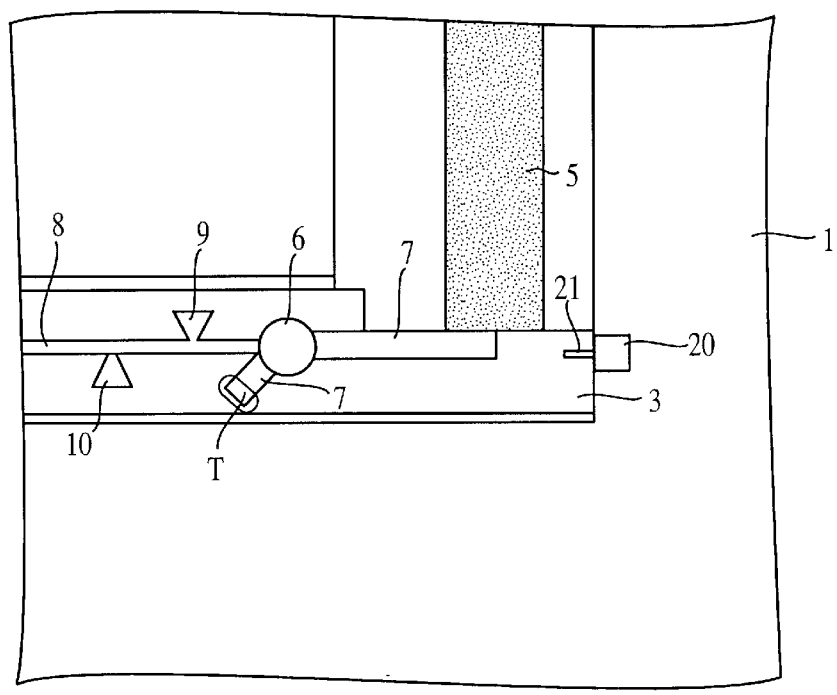
FIG. 4 is a diagram showing the construction of an oscillator in accordance with a second embodiment of the present invention.

Next, the construction of an oscillator in accordance with the second embodiment of the present invention is shown in FIG. 4. FIG. 4 is a plan view showing the oscillator in the state without the upper conductor plate. Unlike the example shown in FIGS. 1A–1C, an electrode 21 and an adjustment terminal 20 connected thereto are provided on the dielectric substrate 3. In this example, a structure for making frequency variable by voltage control is not provided.

In FIG. 4, the electrode 21 is weak-coupled with the line 7, and is arranged so as to monitor oscillation signals by connecting a spectrum analyzer or the like to the adjustment terminal 20. For example, when adjusting an oscillating frequency, trimming is performed with respect to one open end T portion of the line 7 so that the fundamental frequency thereof becomes a half value of the second harmonic frequency to be actually used.

Since the electrode 21 is, thus, merely weak-coupled with the line 7, it exerts no adverse effect. In addition, since the electrode 21 is weak-coupled with the line 7 where the fundamental wave component has not been removed, and monitors oscillation signals, it can measure a fundamental wave frequency which is a frequency lower than the oscillation frequency to be outputted to the NRD guide. This permits use of a low cost spectrum analyzer.

Also, as shown in the first embodiment, the stabilization of the oscillation frequency can be achieved by providing a variable reactance element to permit the oscillation frequency to be controlled by voltage, and by executing a feedback with respect to the control voltage so as to be a predetermined frequency, after detecting the oscillation frequency from the signal taken out from the above-mentioned adjustment terminal.

Figure 5:
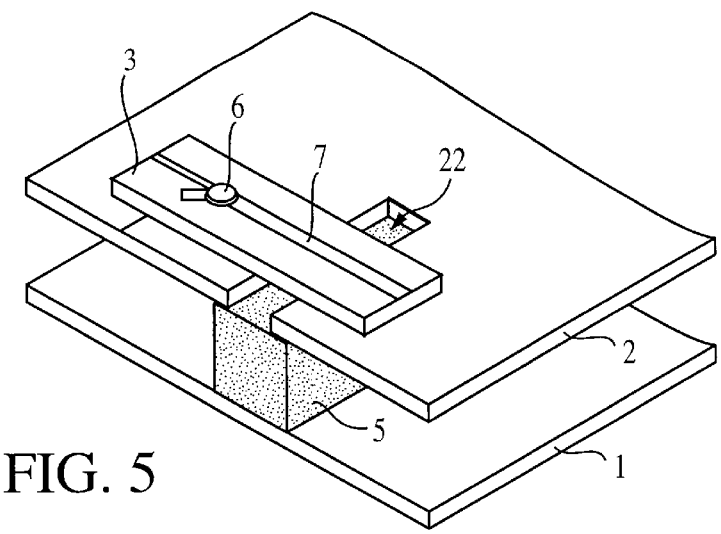
FIG. 5 is a diagram showing the construction of an oscillator in accordance with a third embodiment of the present invention.

Next, the construction of an oscillator in accordance with the third embodiment of the present invention will be described with reference to FIG. 5.

In the first and second embodiments, the dielectric substrate 3 is disposed in the space sandwiched between the upper and lower conductor plates, but in this third embodiment, a dielectric substrate 3 is disposed on the outside of the upper and lower conductor plates. Specifically, a slot 22 is formed along the longitude of the dielectric strip 5 on the upper conductor plate 2, and the dielectric substrate 3 is disposed so that the line 7 of an oscillation circuit is orthogonal to the slot 22. The construction of this dielectric substrate 3 is basically the same as one shown in FIGS. 1A–1C or 4. However, the mode (TEM mode) of microstrip line propagating through the line 7 of the oscillating circuit, and the LSM mode of the dielectric line are magnetic-field coupled via the slot 22. Thus, the magnetic field of the TEM mode spreads via the slot 22, whereas that of the LSM mode hardly leaks from the slot 22 to the dielectric substrate 3 side. Consequently, the LSM mode makes a unidirectional coupling from line 7 to the NRD guide. With such a construction, even if a reflected wave on the discontinuous portion of the NRD guide returns to the Gunn diode side, the signal returned to the Gunn diode 6 side would include no fundamental wave component, since the signal level thereof is suppressed, and the NRD guide propagates no fundamental wave component. The influence of the reflected wave on the oscillation characteristics is therefore very little.

Next, the construction of an oscillator in accordance with the fourth embodiment of the present invention will be described with reference to FIGS. 6A6B.

Figure 6A:
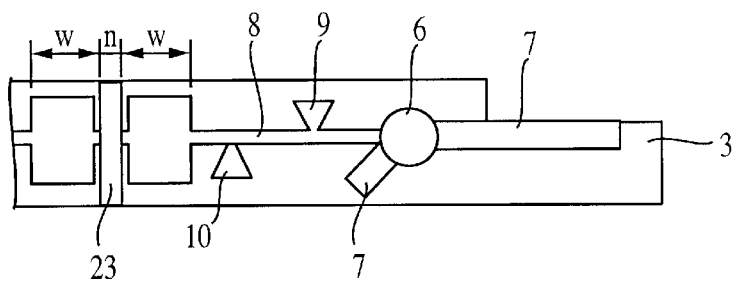
FIGS. 6A–6B are diagrams showing the construction of an oscillator in accordance with a fourth embodiment of the present invention.
Figure 6B:
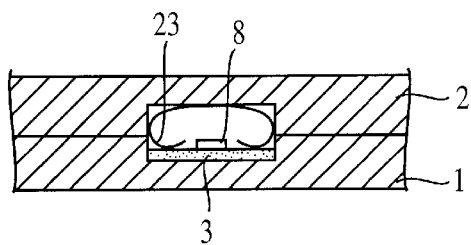

FIG. 6A is a plan view showing an oscillation portion in the state without the upper conductor plate. FIG. 6B is a view of a cross-section orthogonal to the bias line, in the state with the upper conductor plate provided. In this example, on the bias line 8, repeated patterns are alternately formed, wherein portions w each have wider widths and portions n each have narrower widths. These patterns provide characteristics of a low pass filter cutting off an oscillation signal component. Also, a concave spring 23 is disposed on a narrower path portion indicated by n. The concave spring 23 presses the dielectric substrate 3 against the lower conductor plate 1 side in the space between the dielectric substrate 3 and the upper conductor plate 2, in the state wherein the dielectric substrate 3 is disposed in the space formed between the upper and lower conductor plates 1 and 2. Therefore, even if the dielectric substrate 3 is somewhat warped, the dielectric substrate 3 is securely fixed in the space created by the upper and lower conductor plates, and provides stable frequency characteristics.

Since the concave spring is provided on the narrower path of the bias line, there is no risk that the concave spring has an electric continuity with the bias line, and since this portion is a portion where the bias line works equivalently as an inductor, it hardly exerts any effect on the bias line.

Next, an example in which a planar dielectric line is used as an output transmission line will be described with reference to FIG. 7.

Figure 7:
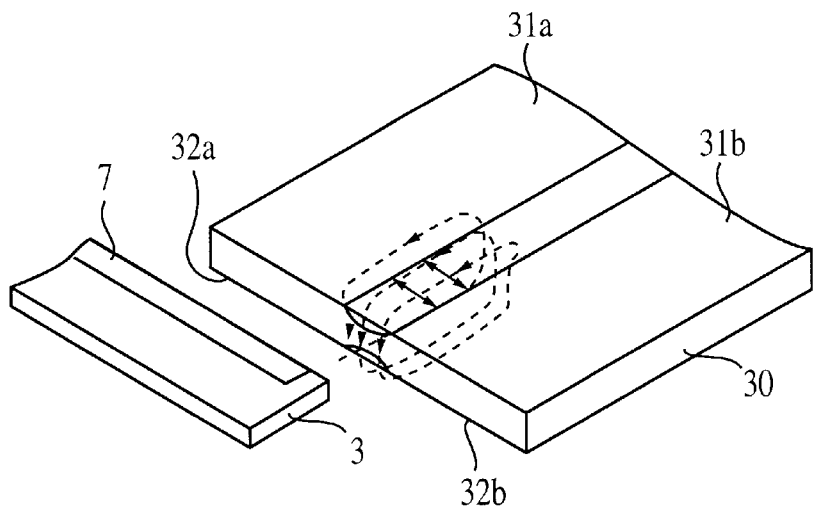
FIG. 7 is a diagram showing the construction of an oscillator in accordance with a fifth embodiment of the present invention.

FIG. 7 is a perspective view showing the construction of the main section of an oscillator including an oscillation circuit and an output transmission line. In FIG. 7, reference numeral 30 denotes a dielectric substrate. The dielectric substrate 30 has electrodes 31*a* and 31*b* disposed on the top surface thereof, and forms a slot at the area sandwiched between the two electrodes 31*a* and 31*b*. The dielectric substrate 30 has also electrodes 32*a* and 32*b* disposed on the bottom surface thereof, and forms a slot at the area sandwiched between the two electrodes 32*a* and 32*b*. With this structure, a planar dielectric line (PDTL) is formed which uses the area sandwiched between the upper and lower slots in the dielectric substrate, as a propagation path. The broken line arrow and the solid line arrow in the FIG. 7 represent magnetic field vector and electric field vector, respectively. In this figure, reference numeral 3 denotes a dielectric substrate. The dielectric substrate 3 has a microstrip line formed by a line 7 thereon. The line 7 and the above-mentioned planar dielectric line are disposed so that the surface of the line 7 is flush with the surface at the central portion of the planar dielectric line, and so that the line 7 becomes orthogonal to the electromagnetic wave propagation direction of the planar dielectric line. The constructions of other portions are similar to those shown in FIGS. 1A–1C.

By such a construction, the planar dielectric line and microstrip line are magnetic-field coupled, and achieve an oscillator using a planar dielectric line as an output transmission line.

Next, as a embodiment of radio equipment, a construction example of a millimeter wave radar will be described with reference to FIG. 8.

Figure 8:
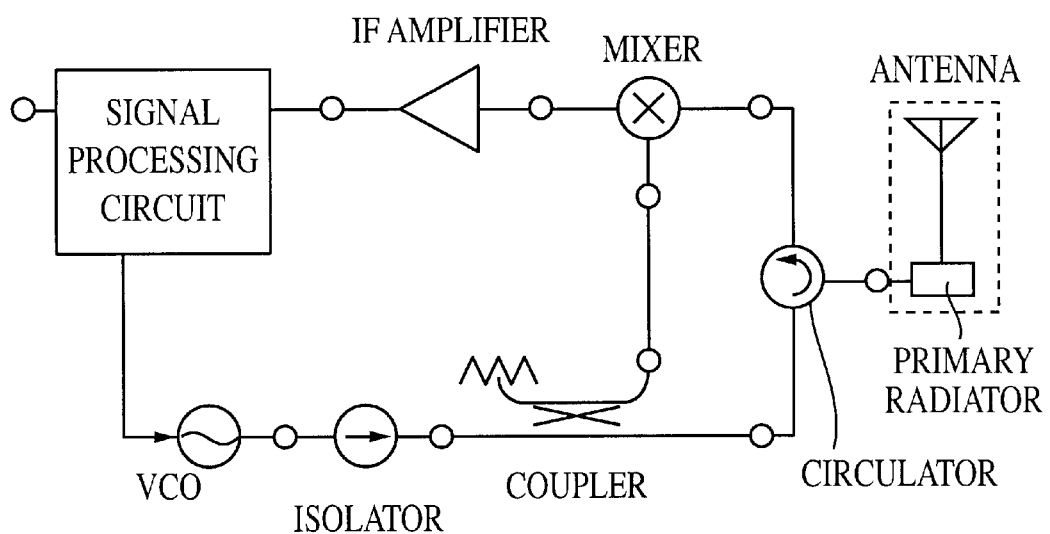
FIG. 8 is a block diagram showing the construction of a millimeter wave radar in accordance with a sixth embodiment of the present invention.

In FIG. 8, VCO is an oscillator shown in the first embodiment. This VCO performs frequency modulation in response to a signal, such as a triangular signal, given by a signal processing circuit, and outputs an oscillation output signal. This oscillation output signal is transmitted to a primary radiator via an isolator, a coupler, and a circulator in this sequence. Thereby, the primary radiator transmits a millimeter wave with a predetermined beam width via a dielectric lens or the like. The coupler gives one portion of the transmission signal to a mixer as a local signal. When the reflected wave from an object enters into the primary radiator, a reception signal is given to the mixer via the circulator. The mixer creates an intermediate frequency signal by mixing the reception signal from the circulator and the local signal. An IF (inter intermediate frequency) amplifier amp lifies this intermediate frequency signal and gives it to the signal processing circuit. The signal processing circuit detects the distance therefrom to the object and the relative speed of the object, from the modulation signal and the intermediate frequency signal given to the VCO.

In each of the embodiments, although a pill type Gunn diode was used, a surface mount type Gunn diode may be mounted on a dielectric substrate. Also, as a negative resistance element, a three terminal type element such as a MOS-FET may also be employed, rather than a Gunn diode. For example, when using a MOS-FET, a line for connection with a NRD guide is connected to the drain thereof, a resonance line is connected to the source thereof, and a bias line is connected to the gate thereof.

Furthermore, in each of the embodiments, the Gunn diode of which fundamental wave is 38 GHz was used so as to obtain an 76 GHz band oscillation signal which is the second harmonic thereof, but depending on the purpose, a cut-off frequency may be set between a second harmonic and a third harmonic so as to transmit the harmonic component of an order not less than a third order to an output transmission line.

Moreover, in each of the embodiments, although the coupling between lines was executed by approaching the line 7 provided on the dielectric substrate 3 to the end portion of a dielectric strip 5, the line of an oscillation circuit and an NRD guide may be coupled by dividing the dielectric strip along a surface parallel to upper and lower conductor plates into upper and lower portions and by disposing a dielectric substrate between the upper and lower dielectric strips.

As described hereinabove, in the oscillator in accordance with the first aspect of the present invention, high frequency signals which are difficult to obtain directly by oscillation, can be easily obtained. In this oscillator, since the oscillation circuit is formed using a dielectric substrate, and an output transmission line including a dielectric material portion is used between the two conductor surfaces parallel to each other, a size reduction is achieved, the adjustment of a resonance frequency is facilitated, and suitability for mass production is provided, leading to a reduction in cost, unlike the case where a cavity waveguide is used. Also, since a fundamental wave component and/or lower order harmonics are reliably cut off on the output transmission line, and only the higher harmonic component to be used is transmitted, there is no risk that the higher harmonic signal to be used attenuates, resulting in no loss.

Furthermore, in the oscillator in accordance with the first aspect of the present invention, since the structure for coupling the line formed on the dielectric substrate with the output transmission line is simplified, a reduction in an overall size can be attained.

Moreover, in the oscillator in accordance with the first aspect of the present invention, since the impedance matching between the negative resistance element, such as the Gunn diode, having a low impedance and the line can be easily obtained, the power output can be enhanced.

Also, in the oscillator in accordance with the first aspect of the present invention, since there is no risk that an oscillation signal leaks to the bias line, the modulation characteristics and the oscillation efficiency are improved.

In addition, in the oscillator in accordance with the first aspect of the present invention, since an oscillation frequency can be made variable by the control voltage, it is possible to use the present oscillator as a voltage controlling oscillator.

Besides, in the oscillator in accordance with the first aspect of the present invention, since a fundamental fre quency signal having a lower frequency than the frequency to be used can be monitored without exerting an adverse effect to the oscillation circuit, a low price measurement equipment may be used.

Furthermore, in the oscillator in accordance with the first aspect of the present invention, since the occurrence of the return signal from the dielectric line to the oscillation circuit is suppressed, and the fundamental frequency signal does not return, stable oscillation characteristics can be achieved.

Moreover, in the oscillator in accordance with the first aspect of the present invention, since the occurrence of variations in characteristics due to the deformation of dielectric substrate is reduced, stable characteristics can be attained.

By the radio equipment in accordance with the second aspect of the present invention, a low-loss and high-gain millimeter wave radar which is small in overall size, can be obtained.

While the invention has been described in connection with embodiments thereof, many modifications and variations of the present invention are possible in the light of the above teachings. It is therefore to be understood that within the scope of the appended claims, the invention may be practiced otherwise than as specifically described.

What is claimed is:

1. An oscillator comprising:

an oscillation circuit formed on a dielectric substrate; and circuit an output transmission line for transmitting oscillation output signals of said oscillation circuit, wherein:

said output transmission line is a transmission line having cut-off characteristics, said output transmission line including a dielectric material disposed between two conductor plates substantially parallel to each other;

the cut-off frequency of said transmission line is determined so as to cut off the fundamental wave component, or the fundamental wave component and lower order harmonic components of an oscillation signal generated by said oscillation circuit, so that higher harmonic components having higher frequencies than the cut-off component or components are propagated;

said output transmission line is a dielectric line formed by disposing a dielectric strip between two conductor plates substantially parallel to each other;

said oscillation circuit is formed by mounting a negative resistance element in the vicinity of a short-circuit position of a line of which at least one end is opened, the line having a length an integral multiple of a half wavelength; and said line and said output transmission line are coupled.

2. An oscillator as claimed in claim 1, further comprising:

stubs provided on a bias line for supplying a bias voltage to said negative resistance element, so that the impedance when viewing a bias power source from a connection point of said negative resistance element exhibits a high impedance at the frequency of said fundamental wave component and the frequencies of said higher harmonic components.

3. An oscillator as claimed in claim 1, further comprising:

a variable reactance element connected to the line of said oscillation circuit; and a line for supplying a control voltage with respect to said variable reactance element.

4. An oscillator as claimed in claim 1, further comprising:

a weak-coupled terminal provided to said oscillation circuit.

5. An oscillator as claimed in claim 1, wherein:

said output transmission line is a dielectric line formed by disposing a dielectric strip between two conductor plates substantially parallel to each other;

a slot is formed in one of said conductor plates;

said dielectric substrate is disposed on the outside of said one of said conductor plates; and said line of said oscillation circuit and said dielectric line are coupled.

6. An oscillator as claimed in claims 1, further comprising:

said dielectric substrate being accomodated in a space defined between said two conductor plates;

said bias line comprising portions each having wider widths alternating with portions each having narrower widths; and a spring for fixing said dielectric substrate at an inner surface of said space; said spring being provided in the vicinity of one of the narrow portions of said bias line.

7. Radio equipment comprising:

an oscillator as claimed in any one of claims 1 through 6;

a transmitting circuit; and a receiving circuit;

wherein said oscillator is connected in said radio equipment so as to provide at least one of: a transmission signal for being transmitted by said radio equipment, and a local signal for mixing with a signal received by said radio equipment.

* * * * *